United States Patent [19]

Yaniger

[11] Patent Number: 4,994,783
[45] Date of Patent: Feb. 19, 1991

[54] ELECTRONIC DEVICE FABRICATION ON NON-CONDUCTIVE POLYMER SUBSTRATE

[75] Inventor: Stuart I. Yaniger, Ventura, Calif.
[73] Assignee: Lockheed Corporation, Calabasas, Calif.
[21] Appl. No.: 302,533
[22] Filed: Jan. 26, 1989
[51] Int. Cl.$^5$ .............................................. H01C 1/012
[52] U.S. Cl. .................................. 338/308; 252/500; 428/195; 361/315
[58] Field of Search ................ 252/500, 502; 428/195, 428/215, 411.1, 473.5; 338/306, 307, 308, 309, 314; 361/311, 315, 323; 336/30, 65

[56] References Cited

U.S. PATENT DOCUMENTS

| | | | |
|---|---|---|---|
| 3,813,264 | 5/1974 | Booth et al. | 252/500 |
| 3,835,102 | 9/1974 | Shinohara et al. | 252/500 |
| 4,466,910 | 8/1984 | House | 252/500 |
| 4,466,911 | 8/1984 | House | 528/397 |
| 4,505,845 | 3/1985 | House | 252/518 |
| 4,505,846 | 3/1985 | House et al. | 252/500 |
| 4,511,492 | 4/1985 | Swedo et al. | 528/422 |
| 4,519,940 | 5/1985 | Schroeder et al. | 252/500 |
| 4,615,829 | 10/1986 | Tamura et al. | 252/500 |
| 4,620,943 | 11/1986 | Denisevich et al. | 252/518 |
| 4,861,640 | 8/1989 | Gurol | 428/137 |

Primary Examiner—Bruce A. Reynolds
Assistant Examiner—Marvin M. Lateef
Attorney, Agent, or Firm—Max Geldin

[57] ABSTRACT

A process for fabricating an electronic device on a non-conductive polymer substrate, particularly from the family of polyaniline, comprises applying a covalent doping agent, such as an R+ donor compound, where R is an organic group, e.g., methyl iodide, to a preselected portion of a base-type non-conductive polymer substrate containing carbon-nitrogen linkages, and converting such preselected portion of the polymer substrate to an electrically conductive polymer portion, by covalent linkage of the R groups of such donor compound, to nitrogen atoms of the non-conductive polymer substrate. Electronic devices, such as resistors, capacitors, inductors, printed circuits and the like, can be provided by the invention process, in the form of light-weight polymers containing no metal, and which are stable and wherein the conductive portions are non-diffusing.

11 Claims, 1 Drawing Sheet

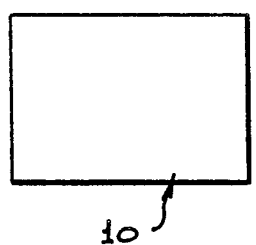
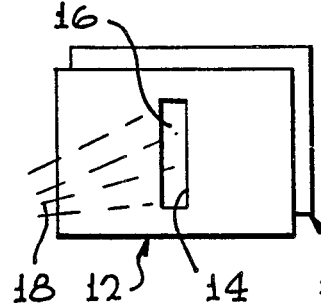
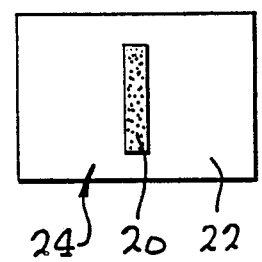
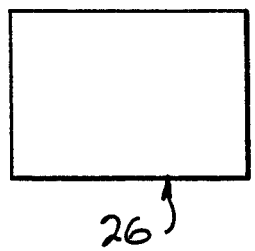
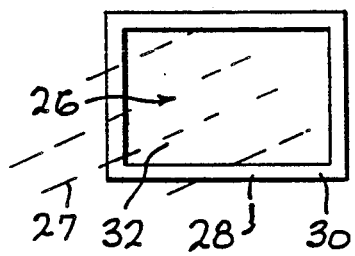
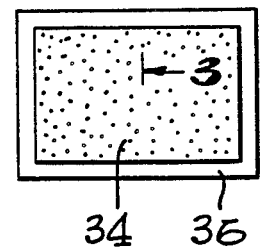
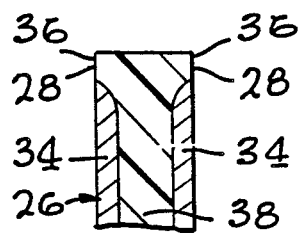
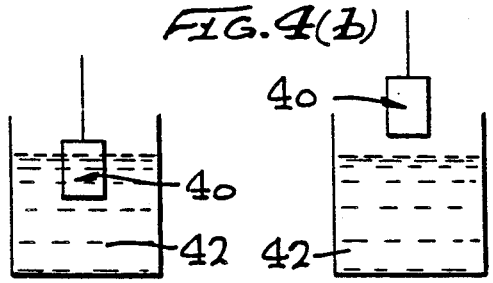
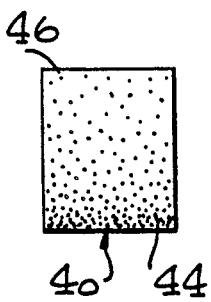
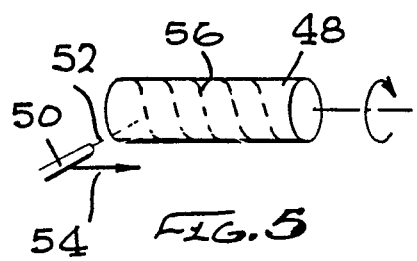
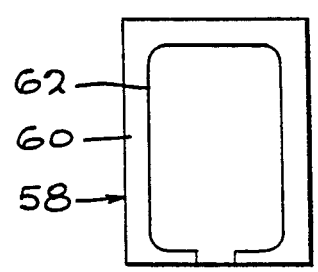

ELECTRONIC DEVICE FABRICATION ON NON-CONDUCTIVE POLYMER SUBSTRATE

BACKGROUND OF THE INVENTION

The present invention relates to the production of electronic devices and is particularly concerned with a process for the fabrication of electronic devices employing a non-conductive polymer substrate, portions of which can be selectively rendered conductive by suitable chemical treatment.

The free-base form of polyaniline is electrically non-conductive. Protonic acid doping of polyaniline by reaction of polyaniline with a protonic acid HX where X is, for example, Cl, to produce electrically conductive polyaniline is known, for example, as disclosed in A. G. MacDiarmid, et al, Mol. Cryst. Liq. Cryst., 121, 173 (1985). Conductive polyaniline of this type has been employed in batteries, as disclosed in French Patent No. 1,519,729.

However, if a film or bulk polymer of a material, such as polyaniline, is subjected to treatment in preselected regions, as by normal protonic acid treatment, to form doped conductive regions, for example, to form a conductive strip, such conductive regions or strip remains conductively stable only for a very short time, after which such conductive regions diffuse, causing the entire piece to have constant conductivity.

Further, base-type conductive polymers, as represented by the protonic acid-doped polyaniline class of conductive polymers, are unstable and degrade when exposed to water. Stability on contact with water is extremely rare in prior art conducting polymers, such as produced by treatment of polyaniline with protonic acids.

An object of the present invention is to enable the construction of polymeric electronic devices without the use of metals.

Another object of the invention is to provide a process for producing electronic devices on a non-conductive polymer substrate which can be selectively converted by suitable treatment to provide conductive portions which do not tend to diffuse.

Still another object is the provision of novel procedure for the production of electronic devices, as noted above, wherein the conductivity of the conducting portions of such devices does not degrade if the components of the device are exposed to water.

SUMMARY OF THE INVENTION

The above objects are achieved, according to the invention, by the carbocation doping of preselected portions of a base-type non-conductive polymeric substrate, particularly from the polyaniline family, to form conducting portions on the non-conductive substrate. This can be accomplished, e.g., according to one embodiment, by applying a mask to the non-conductive polymer substrate, leaving certain preselected areas or regions of the polymer substrate not covered by the mask exposed, and treating the exposed areas of the polymer substrate, as by spraying, with an organic material of a type which reacts with the exposed polymer regions to render them conductive, by covalent linkage of the organic group to the nitrogen atoms of the polymer.

The base-type non-conductive polymer forming the substrate is of the type which contains carbon-nitrogen linkages, as in polyaniline. The material which is applied, as by spraying, immersion or brushing, to the preselected exposed areas of the polymer substrate is an $R+$donor compound, where R is an organic cation group, such R group being capable of covalently binding to the nitrogens of the polymer, and forming an electrically conductive polymer in which the R groups are covalently linked to the nitrogen atoms of the polymer, in the preselected or exposed portions of the substrate.

More particularly, in one embodiment, the preselected or exposed portions of the non-conductive polymer substrate containing carbon-nitrogen linkages, particularly as represented by the free-base polyaniline, can be treated and reacted with an $R+$donor compound, such as $R+X-$ or $R_3O+X^{31}$, where $R+$ is a strong donor, i.e., an organic cation, such as an alkyl group, e.g., $CH_3+$, and $X-$ is a stable anion, such as $I-$, e.g., as provided by $CH_3I$, to form a polymer salt in which a covalent bond is formed between a nitrogen and the orqanic R group.

The reaction of base-type non-conductive polymers, such as polyaniline, with a compound or agent of the above type to produce base-type conducting polymers, is disclosed in my co-pending application, Ser. No. 920,474 filed Oct. 20, 1986, now U.S. Pat. No. 4,798,685, issued Jan. 17, 1989 titled "Production of Base-Type Conducting Polymers", and assigned to the same assignee as the present application.

In another embodiment, such preselected portions of the non-conductive polymer substrate containing carbon-nitrogen linkages can be treated with an $R+$ donor compound, such as $R_2SO_4$, $R'SO_2Cl$, or $R_3''SiCl$, where $R+$, $R'SO_2+$ or $R_3''Si+$ is a strong donor or organic cation, and $RSO_4$ or the $Cl-$ is a stable anion, to form a polymer salt in which a covalent bond is formed between the nitrogen of the polymer and such donor cation.

The reaction of base-type non-conductive polymers, such as polyaniline, with a compound, such as $R_2SO_4$, $R'SO_2Cl$, or $R_3''SiCl$, to produce base-type conducting polymers, is disclosed in the co-pending application, Ser. No. 13,305 filed Feb. 11, 1987, by Stuart I. Yaniger, et al, now U.S. Pat. No. 4,806,271, issued Feb. 21, 1989 titled "Preparation of Base-Type Conductive Polymers", and assigned to the same assignee as the present application.

The resulting polymer substrate, following treatment with one of the above compounds, has electrically conductive portions in pre-selected areas surrounded by the non-conductive polymer substrate. In the exposed conductive, e.g., non-masked, areas wherein there is a covalent linkage between the above-noted donor cation groups and nitrogens in the polymer, this results in pinning the conductive region, so that the region to which the treating agent has been applied, e.g., in the form of a strip, remains conductive, with substantially no diffusion taking place to other regions of the substrate. In addition, the preselected conductive regions on the polymer substrate do not lose conductivity on contact with water.

Utilizing the above concept, various electronic components which do not contain metal can be fabricated according to the invention, which are stable, and have the advantages of light weight and flexibility, provided by the use of polymers, as substrate, and which can be fabricated at relatively low cost. Electronic devices which can be fabricated by the invention process include resistors, capacitors, inductors, printed circuits, electronic devices with components having conductivity gradients, etc.

BRIEF DESCRIPTION OF THE DRAWINGS

The invention will be more clearly understood by reference to the detailed description of the invention, set forth hereinafter, taken in conjunction with the accompanying drawings wherein:

FIG. 1 illustrates the steps of the procedure according to the invention, for fabricating a resistor;

FIG. 2 illustrates the steps of the invention process for producing a capacitor;

FIG. 3 is an enlarged cross-section of the capacitor produced by the process of FIG. 2, taken on line 3—3 of FIG. 2(c);

FIG. 4 illustrates the steps of the invention procedure for producing an electronic component having conductivity gradients;

FIG. 5 illustrates the procedure for producing an inductor by the invention procedure; and FIG. 6 illustrates production of an electronic device having a conductive loop formed on a non-conductive polymeric substrate.

DETAILED DESCRIPTION OF THE INVENTION AND PREFERRED EMBODIMENTS

According to the invention, covalent doping of base-type non-conductive polymers, e.g., polyaniline free-base substrates, in preselected regions, yields non-diffusing conductive regions surrounded by insulating polymer substrate. Thus, a passive electronic component can be fabricated by exposure of preselected regions of the substrate base polymer to chemical reactants, such as the above-noted R+ donor compound, which cause the above-noted chemical reaction.

Referring to FIG. 1 of the drawing, illustrating a mode of procedure for producing a resistor according to the invention, numeral 10 illustrates a base-type non-conductive polymer substrate to which a conductive region is to be applied. A preferred form of non conductive base-type polymer employed as substrate are those of the polyaniline family, including polyaniline and derivatives thereof containing naphthyl or biphenyl groups or other aromatic groups, in place of the phenyl groups of polyaniline. Such polymers can include alkyl and aryl substituted polyaniline and its alkyl and aryl substituted naphthyl and biphenyl derivatives, e.g., 2-methyl biphenyl, butyl naphthalene, 2-methyl aniline derivatives, beta phenyl naphthalene and beta tolyl naphthalene. Such polymeric substrates also can include other base-type polymers containing carbon atoms linked to nitrogen, such as cyanogen polymer of the type:

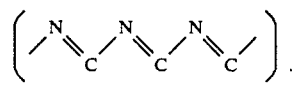

Another type of polymer substrate can include mixtures and blends of the above non-conductive homopolymers and copolymers of the above polymers and other polymers, such as a blend of polyaniline and polymethylmethacrylate, and polymer alloys, such as polybenzinidazole-polyimide alloys, containing carbon-nitrogen groups.

Thus, the term "non-conductive polymer substrate" as employed herein is intended to denote any of the above homopolymer or copolymer materials.

The invention will be described hereinafter, however mostly in terms of the use of the preferred non-conductive free-base polyaniline as non-conductive polymeric substrate. In the case of polyaniline free-base, this is a high polymer having a molecular weight of the order of 50,000 to 80,000. Lower molecular weight polyaniline, such as emeraldine, can be employed, which is an oligomer of polyaniline containing eight (8) subunits and having a molecular weight of about 800 to 900.

There is applied to the surface of the non-conductive polymer substrate 10 a mask 12 having a cut-out strip 14 therein. For this purpose, any conventional maskant which is inert to the reactant or treating agent can be employed. The maskant composition should also be inert with respect to the base polymer of the substrate. For this purpose, metal masks, such as stainless steel, can be employed. Other metals which can be employed as maskant include platinum, gold, nickel, and the like. The metal mask can be suitably adhered to the polymer substrate as by pressure contact, adhesive, and the like, but can be readily removed following chemical treatment. Alternatively, organic maskants containing as an essential ingredient thereof an organic polymer, such as a chloroprene polymer resin, or a styrene butadiene or a styrene ethylene butylene co-polymer, can be employed.

The masked polymeric substrate 12, as seen in FIG. 1(b), is treated, as by spraying, to contact the exposed surface of the polymer substrate within the cut-out area 14 of the mask, with the treating agent. The treating agent with which the exposed area 16 of the polymer substrate is contacted is an R+ donor compound, such as RX, R₃OX, R₂SO₄, R'SO₂Cl, or R₃"SiCl, where R, R'SO₂ or R₃"Si is a group which readily forms a covalent bond with nitrogen, and wherein R, R' and R" each can be alkyl, e.g., methyl, ethyl and the like, and aryl, e.g., p toluene sulfonyl (tosyl), benzyl, tolyl, xylyl and other aromatic moieties, and X is an anion such as halogen, e.g., Cl⁻, I⁻ or Br⁻; PF₆⁻, SbCl₆⁻, and substituted and unsubstituted benzene sulfonate, and the like. The above reaction forms a conductive polymer salt.

Thus, the reactant which forms a covalent chemical bond with the nitrogen of the polyaniline free-base or equivalent polymer noted above, can be,.for example, one of the above R+ donor compounds, such as an alkyl halide, wherein the alkyl group can contain from 1 to 20 carbon atoms, such as methyl iodide, or dimethylsulfate, (CH₃CH₂)₃O+SbCl₆⁻, (CH₃)₂CHI, p-CH₃-C₆H₄SO₂Cl, (CH₃ ₁)₃O+PF₆⁻, (CH₃)₃OSO₃C₆H₄CH₃ and (CH₃)₃SiCl. Also, multifunctional reagents, e.g., ClSO₂-C₆H₄-C₆H₄-SO₂Cl can be employed However, R, R' or R" also can be an oligomeric or polymeric group, e.q., containing from about 20 to about 100,000 carbon atoms, e.g., polyvinyl iodide The reaction for converting the base-type non-conductive polymer portion in the exposed area 16 of the substrate to a conductive polymer can be represented as follows, where RX or R₃OX is the R+− donor compound:

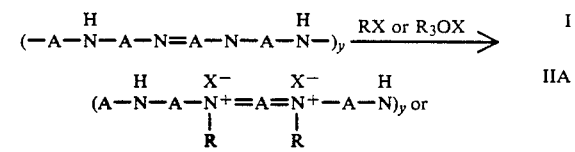

-continued

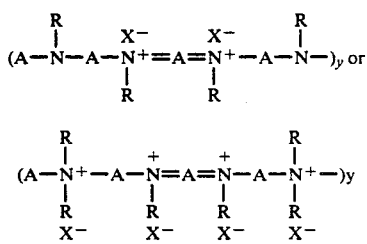

where A is a carbon-containing group, such as aryl, particularly the benzene ring, and including naphthyl and biphenyl, and substituted benzene, naphthyl or biphenyl groups, such as the alkyl and aryl derivatives described above; R and X are as defined above, and y is an integer ranging from about 1 to about 1,000, e.g., about 10 to about 100. When y is in the lower end of the above range, e.g., when y is 1 or 2, the materials are known as oligomers and are intended to be included within the term "polymer" employed herein Where the preferred non-conductive polymer employed as the base substrate is polyaniline free-base (PFB), the general reaction scheme for producing conductive polymer portions when employing the reactant RX or $R_3OX$ is represented below:

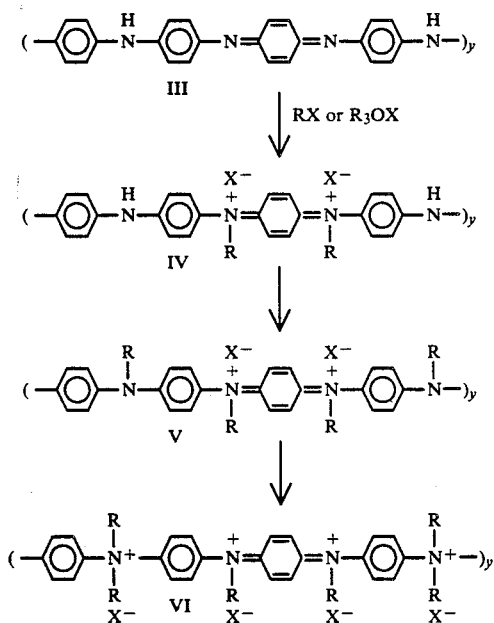

where R, X and y have the values noted above.

In the above representative reactions, it will be understood that the R+ donor reactant can alternatively be $R_2SO_4$, $R'SO_2Cl$ or $R_3''SiQ$, where Q is a halogen, such as Cl or Br. If the reaction is carred out using $R_2SO_4$, R+ is the organic cation which is covalently linked to the N atoms of the polymer and X is the stable $RSO_4^-$ antion. When $R'SO_2Cl$ is the reactant, the organic cation is the $R'SO_2^+$ group, which is covalently linked to the N atoms of the polymer through the S atom of such group, and X is the stable $Cl^-$ anion. When $R_3''SiCl$ is the reactant, the organic cation is the $R_3''Si^+$ group, which is covalently linked to the N atoms of the polymer through the Si atom of such group, and X is the stable $Cl^-$ anion. When $R_3''SiCl$ is the reactant, the organic cation is the $R_3''Si^+$ group, which is covalently linked to the N atoms of the polymer through the Si atom of such group, and X is the stable $Cl^-$ anion.

The reaction can be carried out as a heterogenuous reaction wherein the reactant, e.g., RX, per se, is reacted with the exposed polymer substrate portion, such as polyaniline free-base, or the reactant can be dissolved in a suitable solvent which does not irreversibly react with the R+ donor, such as, e.g., methylene chloride, tetrahydrofuran (THF), acetonitrile, pyridine, dimethylsulfoxide (DMSO) and dimethylformamide (DMF). However, when employing an $R_3OX$ donor compound, such as $(CH_3)_3OX$ and acetonitrile as solvent, the $(CH_3)_3O^+$ group can react with the $CH_3C\equiv N$ solvent to form $CH_3C\equiv N^+-CH_3$ which can also function as a methyl cation donor.

The rate of reaction can range widely, depending on the particular R+ donor or reactant employed, and the period of exposure of the exposed polymer substrate portion 16 to the reactant. If the reaction between the exposed polymer, e.g., polyaniline, substrate portion and the R+ donor compound is carried to completion, the cation or R group can be substituted for every hydrogen on the polymeric chain to form the conductive polymer, as represented by Formula V above. Further reaction results in all amine-like nitrogens forming quaternary ammonium groups, as illustrated by Formula VI above. If the reaction is not carried to completion, only a portion of the hydrogen atoms on the polymer will be substituted by cation or R groups, as illustrated by Formula IV above.

Where the "R+" donor is an "$R_3OX$" donor, an ether, $R_2O$, e.g., dimethyl ether, is given off in the reaction.

The above reactions of an R+ donor compound with a base-type polymer, particularly polyaniline, for producing base type conductive polymers are disclosed in the above co-pending applications, Ser. Nos. 920.474 and 13,305, and such disclosures are incorporated herein by reference.

Following treatment of the exposed portion 16 of the substrate with the spray 18 of chemical treating agent, the mask 12 is removed, leaving a conductive and resistive polyaniline region 20 surrounded by the polyaniline non-conductive or insulating region 22, thus forming a resistor element 24.

Now referring to FIG. 2 of the drawings, a non-conductive sheet 26 formed of a base-type polymer, such as polyaniline free-base, has attached to the surfaces on opposite sides 28 thereof a metal, e.g., steel, mask in the form of a peripheral frame 30 around all four sides of the sheet, leaving an exposed central surface portion 32 of non-conductive polymer- on each side of the sheet.

A spray of a treating agent 27 in the form of an R+ donor compound, such as RX, as described above, is applied to opposite sides 28 of the non-conductive polymer sheet 26 and contacting the exposed portions 32 on opposite sides of the sheet. As a result of the reaction of the treating agent with the exposed portions 32 of the polymer sheet 26, there are formed central conductive regions 34 of conductive polymer or conductive polyaniline on opposite sides 28 of the non-conductive polymer sheet, with a non-conductive or insulating border portion 36 around the conductive central portions 34, and a non-conductive or insulating interior portion 38 (see FIG. 3) between the two conductive regions 34. The resulting non-conductive polymer substrate containing the separated conductive regions 34 can function as a capacitor.

If desired, the treating agent can be painted unto the exposed regions 32 on both sides of the non-conductive polymer sheet 26. Further, if desired, the mask 30 can be omitted, and the entire area on both sides of the non-conductive polymeric sheet 26 can be treated, as by spraying or painting, with the treating agent to form conductive regions over the entire area on opposite surfaces of the polymeric sheet, separated by the interior non-conductive region 38. The thickness of the conductive regions 34 depends on the particular treating or doping agent employed and the period of time of exposure of the surfaces of the polymer sheet to the treating agent. Thus, the capacitance of the resulting capacitor can be controlled by varying the thickness of the conducting regions 34.

In the processes illustrated in FIGS. 1 to 3, the non-conductive polymer substrate is treated in preselected surface portions with a doping agent molecule that covalently attaches to the polymer base site to form conductive regions surrounded or separated by dielectric or insulating regions.

Conductive regions formed on a dielectric or insulating substrate, such as polyaniline free-base, can be made to have conductivity gradients by reacting different parts of the substrate with a covalent doping agent for different lengths of time, or by selective diffusion into a bulk body of the base insulating polymer.

Thus, referring to FIG. 4, a block of base-type non-conductive polymer, such as polyaniline, at 40 can be immersed in a bath of covalent doping agent or $R^+$ donor compound 42, to a predetermined depth, as shown in FIG. 4(a), and by pulling the block of polymer 40 gradually from the treating bath or solution until it is completely withdrawn, as indicated in FIG. 4(b), the resulting polymer block 40, shown in FIG. 4(c), will have a gradient of conductivity ranging from high conductivity at 44 adjacent the bottom of the block to low conductivity at 46 adjacent the upper end of the polymer block. This is due to the fact that the region 46 near the top of the polymer block has been withdrawn first and exposed to the treating agent 42 for the shortest time period, whereas the region 44 adjacent the bottom of the block 40 has been exposed to the treating bath for the longest time period and subjected to the greater amount of diffusion of the liquid treating agent into the block polymer. Thus, a non-conductive polymer, such as polyaniline, can be rendered conductive over a broad range of conductivity, for example, along its length, by selective diffusion, whereas such varying conductivity cannot be imparted to a metal or to a conventional plastic material Another electronic device which can be produced according to the invention by covalent doping of certain portions of a non-conductive base-type polymer, such as polyaniline, is an inductor or induction coil. This can be accomplished by a lathe-type process. Thus, as seen in FIG. 5, to a rod of base polymer 48 there is applied, from a suitable spray gun 50 a spray of cationic doping agent or $R^+$ donor compound of the above types. The rod of base polymer 48 is rotated as in a clockwise direction, viewing FIG. 5, and the spray gun 50 is moved or translated in a horizontal direction at a constant rate, parallel to the axis of the rod, as indicated by the arrow 54. This results in the formation of a helical line or coil of conductive polymer, indicated by dotted lines 56, around the outer periphery of the non-conductive rod 48, defined by the line of impingement of the spray 52 on the outer surface of the rod 48.

Instead of employing a lathe-type process for fabricating an inductor according to the invention, as seen in FIG. 6, an inductor 58 can also be produced by utilizing a sheet or block 60 of non-conductive base-type polymer, such as polyaniline, and, for example, by means of a paint brush having a liquid covalent doping agent thereon, according to the invention, painting a conductive loop 62 or any other desired shape, on a configuration of such loop or shape formed on the insulating sheet 60, by reaction of the covalent doping agent applied by the paint brush, with the non-conductive base-type polymer.

Also, employing one of the procedures noted above, e.g., the masking procedure illustrated in FIG. 1(b), or by the painting procedure illustrated in FIG. 6, a printed circuit board can be made by applying a covalent doping agent as described above to predetermined portions of a base-type non-conductive polymeric substrate, such as polyaniline, to provide an entirely plastic printed circuit board which does not employ a metal, such as copper, as the conductor.

The following are examples of practice of the invention:

EXAMPLE I

To a surface of a sheet of polyaniline free-base was applied a stainless steel mask, as illustrated in FIG. 1(b). A 1 molar solution of triethyloxonium hexachloroantimonate in methylene chloride was applied by spraying over the exposed area 16 of the polyaniline substrate. The mask was removed, providing a conductive trace or region 20 on the insulating polymer, to form a resistor. The conductive trace 20 remains non-diffusing over an extended time period, and the conductivity thereof is not degraded by exposure to water.

EXAMPLE II

A polyaniline free-base block polymer was exposed by spraying on opposite sides thereof, generally according to the procedure illustrated in FIG. 2, with pure dimethylsulfate. The resulting polymer substrate had conductive areas on opposite sides thereof, as illustrated at 38 in FIG. 3, and functions as a capacitor.

EXAMPLE III

A polyaniline free-base block polymer was immersed in a solution of 1 molar methyl iodide in THF and the block was gradually completely withdrawn from the treating solution, as illustrated in FIG. 4. The resulting block polymer had a conductivity gradient ranging from high conductivity at the lower end of the block to low conductivity adjacent the upper end of the block, as illustrated in FIG. 4(c).

EXAMPLE IV

An inductor was made according to the procedure illustrated in FIG. 5, by impinging a spray of trimethyloxonium hexafluorophosphate in methylene chloride on a rotating cylindrical rod of polyaniline free-base, while the spray was moved transversely of the rod and parallel to the axis thereof. A helical conductor was formed around the outer periphery of the rod.

From the foregoing, it is seen that the invention provides novel procedure for fabricating novel electronic devices without employing metal and resulting in lightweight, reliable devices formed entirely of polymeric material, and having stable conductivity and free of conductivity degradation on contact with water.

While particular embodiments of the invention have been described for purposes of illustration, it will be understood that various changes and modifications within the spirit of the invention can be made, and the invention is not to be taken as limited except by the scope of the appended claims.

What is claimed is:

1. An electronic device free of metal, which comprises a base-type non-conductive polymer substrate containing carbon-nitrogen linkages and having an electrically conductive polymer region comprising an organic dopant group covalently linked to nitrogen atoms of said polymer substrate.

2. The device of claim 1, wherein said dopant group is selected from the class consisting of alkyl, aryl, $R'SO_2$, and $R_3''Si$, where $R'$ and $R''$ are alkyl or aryl, and an anion also linked to said nitrogen atoms, said anion being selected from the group consisting of halogen, $PF_6^-$, $SbCl_6^-$ and benzene sulfonate.

3. The device of claim 2 wherein said electrically conductive polymer region has the formula

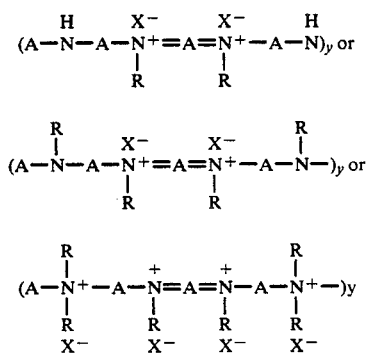

where R is said dopant group, X is said anion, and y is an integer ranging from about 1 to about 1,000.

4. The device of claim 2, wherein said polymer substrate is selected from the group consisting of polyaniline, its naphthyl and biphenyl derivatives, and alkyl and aryl substituted polyaniline and its alkyl and aryl substituted naphthyl and biphenyl derivatives.

5. The device of claim 4, wherein said polymer substrate is polyaniline.

6. The device of claim 5, wherein said electrically conductive polymer region has the formula

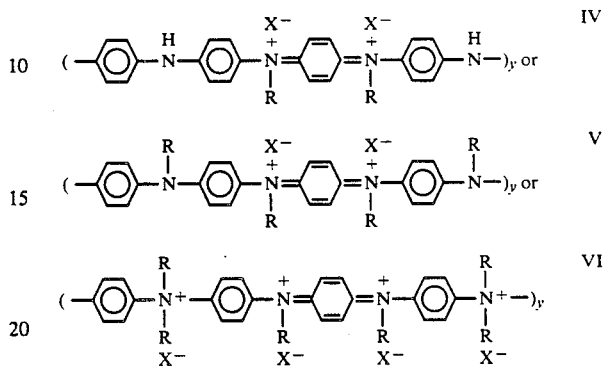

where R is said dopant group, X is said anion, and y is an integer ranging from about 1 to about 1,000.

7. The device of claim 4, wherein said conductive polymer region is in the form of a resistive strip surrounded by non-conductive polymer substrate, and forming a resistor.

8. The device of claim 4, wherein said non-conductive polymer substrate is in the form of a block having substantially parallel sides, and containing conductive polymer regions on opposite sides of said substrate separated by a thickness of non-conductive polymer substrate, and forming a capacitor.

9. The device of claim 4, wherein said conductive polymer region has varying conductivity.

10. The device of claim 4, wherein said non-conductive polymer substrate is in the form of a cylinder, and said conductive polymer region is in the form of a helical conductive polymer coil on said non-conductive polymer substrate, and forming an inductor.

11. The device of claim 4, wherein said non-conductive polymer substrate is in the form of a sheet, and said conductive region is in the form of a conductive polymer loop on said non-conductive polymer substrate, and forming an inductor.

* * * * *